(12) United States Patent
Van Der Mast et al.

(10) Patent No.: US 7,379,579 B2
(45) Date of Patent: May 27, 2008

(54) IMAGING APPARATUS

(75) Inventors: Karel Diederick Van Der Mast, Helmond (NL); Arno Jan Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 603 days.

(21) Appl. No.: 10/496,630

(22) PCT Filed: Nov. 27, 2002

(86) PCT No.: PCT/EP02/13399

§ 371 (c)(1),
(2), (4) Date: Oct. 27, 2004

(87) PCT Pub. No.: WO03/046662

PCT Pub. Date: Jun. 5, 2003

(65) Prior Publication Data

US 2005/0062948 A1    Mar. 24, 2005

(30) Foreign Application Priority Data

Nov. 27, 2001    (EP) ................................. 01204567

(51) Int. Cl.
*G06K 9/00*    (2006.01)
(52) U.S. Cl. ........................... 382/145; 355/53; 378/34
(58) Field of Classification Search .................. 372/92;
355/53, 67; 356/301, 318, 351, 401, 417,
356/548; 382/145; 378/2, 34, 140, 185
See application file for complete search history.

(56) References Cited

U.S. PATENT DOCUMENTS

| 5,098,191 | A | 3/1992 | Noguchi et al. ............ 356/394 |
| 5,142,132 | A | 8/1992 | MacDonald et al. ..... 250/201.9 |
| 6,278,514 | B1 | 8/2001 | Ohsaki ........................ 355/55 |
| 6,507,388 | B2 * | 1/2003 | Burghoorn ................... 355/53 |

FOREIGN PATENT DOCUMENTS

| EP | 0 552 953 A1 | 7/1993 |
| GB | 2 049 964 | 12/1980 |
| GB | 2 049 964 A | 12/1980 |
| WO | WO 92/11567 | * 7/1992 |

* cited by examiner

*Primary Examiner*—Samir Ahmed
*Assistant Examiner*—Mehdi Rashidian
(74) *Attorney, Agent, or Firm*—Pillsbury Winthrop Shaw Pittman, LLP

(57) ABSTRACT

An imaging apparatus having an illuminator configured to condition a beam of radiation having a wavelength equal to or shorter than 365 nm; a support structure to support a programmable patterning device, the programmable patterning device configured to pattern the beam according to a desired pattern; a substrate table configured to hold a substrate; a projection system configured to project the patterned beam onto a target portion of the substrate; a beam splitter located between the programmable patterning device and the substrate table configured to divert aside a portion of the patterned beam; and an image detector configured to analyze the portion of the patterned beam.

18 Claims, 4 Drawing Sheets

IMAGING APPARATUS

This application is the National Phase of International Application PCT/EP02/13399 filed Nov. 27, 2002 which designated the U.S. and that International Application was published under PCT Article 21(2) in English.

The present invention relates to an imaging apparatus comprising:
- a radiation system for supplying a projection beam of radiation;
- a support structure for supporting programmable patterning means, the programmable patterning means serving to pattern the projection beam according to a desired pattern;
- a substrate table for holding a substrate; and
- a projection system for projecting the patterned beam onto a target portion of the substrate.

The term "programmable patterning means" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the programmable patterning means can comprise one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the programmable patterning means as hereabove set forth.

In a (semiconductor) manufacturing process using an imaging apparatus as here described, a device pattern is imaged onto a substrate that is at least partially covered by a layer of radiation-sensitive material (resist). Prior to this imaging step, the substrate-may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-0672504, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

An imaging apparatus as specified in the opening paragraph is currently employed to make mask writing machines, e.g. by the firm Micronic in Sweden. Such a mask can be used in a lithographic projection apparatus, which repetitively images the mask pattern onto a photo-sensitive substrate—such as a photoresist-coated silicon wafer—as part of the broader manufacturing process involved in producing integrated devices, such as integrated circuits (ICs). The substrate in such a mask writing machine is, for example, a metallized plate (e.g. a Cr-coated quartz or $CaF_2$ plate) that has been coated with a layer of photoresist. The idea behind such a mask writing machine is that an electronic file of the (highly complex) mask pattern is used to matrix-address the patterning means, which then divert a patterned radiation beam onto a small portion of the mask plate. By changing the pattern in the patterned beam in accordance with the electronic file, and concurrently moving the beam over the whole surface of the mask plate (in either a scanning or a stepping motion), the final mask pattern is built up as a sum of combined Ouxtaposed) sub-patterns from the patterned beam. For this reason, such a machine is sometimes referred to as a "direct-write" machine.

Although machines as described in the previous paragraph have heretofore been used only in the manufacture of masks, it is—at least in principle—possible to use them in the manufacture of semiconductor and other integrated devices. In such a case, the mask plate would be replaced by, for example, a Si wafer, and the pattern built up on the wafer by the patterning means would correspond to an array of die patterns. However, a major drawback of such an application would be its very low throughput: whereas current direct-write machines might be expected to achieve a throughput of the order of one substrate per day, a state-of-the-art lithographic projection apparatus has a throughput of the order of 100 substrates per hour. Nevertheless, it might still be interesting to pursue such an application: for example, in the case of a foundry making a small batch of a particular integrated device (such as a dedicated ASIC), it might be more attractive to endure a slow direct-write process as delivered by a machine as described above rather than to entail the very high costs (often of the order of 50-100 thousand U.S. dollars) of making a special mask for the batch in question. At the moment, such a choice might only be attractive in the case of a very small batch of a very expensive device; however, it would become much more attractive if the throughput of direct-write machines could be increased. More information with regard to conventional lithographic apparatus as here-described can be gleaned, for example, from U.S. Pat. No. 6,046,792, incorporated herein by reference.

One of the problems associated with direct-write machines concerns data processing. The pattern produced by the patterning means is generally determined by electronic signals passed to the individual "pixels" in the patterning means. Since there are typically very large numbers of such pixels involved (of the order of 100,000-1,000,000 or more), and since the pattern produced by those pixels is regularly altered (as a result of the sub-pattern summing described two paragraphs previously), this generally results in huge volumes of electronic data being passed to the patterning means during a typical exposure run. As in any such system, it is possible for pixel errors to occur, e.g. as a result of electronic errors (statistical bit errors) or mechanical errors (hysteresis in individual pixels). Such errors can cause unwanted alteration of the pattern to be projected on the substrate, which in turn may lead to failure or sub-optimal functioning of the integrated devices (or mask) ultimately resulting from the lithographic process.

At relatively low throughputs, the problems described in the previous paragraph are not necessarily a substantial issue: one can, for example, build up the projected pattern in several superimposed passes, so that a statistical pixel error occurring during one pass will be largely compensated by successive and/or previous passes without that pixel error. However, when striving for higher throughput, one may not be able to afford the time overhead associated with the desired number of multiple passes in such a scenario. Moreover, attempts to increase throughput by increasing the number of pixels in the patterning means will also generally exacerbate the problem, since the risk of statistical pixel errors will increase in proportion to the number of pixels present.

It is an object of the present invention to alleviate these problems. More specifically, it is an object of the present invention to provide an apparatus as described in the opening paragraph, which apparatus is less prone to the effects of pixel errors than prior-art direct-write apparatus.

These and other objects are achieved according to the invention in an imaging apparatus as specified in the opening paragraph, characterized in that the apparatus further comprises:

beam splitting means, provided between the programmable patterning means and the substrate table, serving to divert aside a portion of the patterned beam;

image detection means, for analyzing said portion of the patterned beam.

The apparatus according to the invention provides a method of monitoring the actual (aerial) image produced by the programmable patterning means, as an alternative to merely trusting that the electronic data passed to the patterning means will produce the desired pattern. In this manner, pixel errors can be detected in real time rather than after retrospective inspection of the imaged patterns, allowing pixel errors to be detected and corrected before they lead to manufacturing flaws.

In a particular embodiment of the invention, the image detection means are embodied to compare an actual image produced by the (main) patterning means with a reference image produced by reference patterning means. In such a scenario, the electronic data stream going to the main patterning means is also passed to the reference patterning means, in which case both patterning means should produce the same pattern. If a statistical pixel error occurs in the main pattern, it is highly unlikely that the same error will occur in the reference pattern; in such a case, comparison of the two patterns will reveal the error, and even the location of the culprit pixel. If any such pixel error is detected, a reset can be performed and the main patterning means "re-fired" with the relevant electronic data, before actual imaging occurs.

In an exemplary embodiment of the situation in the previous paragraph, the reference patterning means produce an (aerial) image that is a negative of the image produced by the main patterning means; this can, for example, be achieved by employing an inverter in the data stream to the reference patterning means. Adding the main and reference images should then produce a uniform black image on the image detection means, except in the case of a pixel error, which will show up as a bright pixel.

The image detection means employed in the invention may comprise, for example, a charge-coupled device (CCD) for image detection purposes. Alternatively, they may comprise a detector such as a CMOS detector, photomultiplier tube or photodiode.

According to a further aspect of the invention there is provided a device manufacturing method comprising the steps of:

(a) providing a substrate that is at least partially covered by a layer of radiation-sensitive material;

(b) providing a projection beam of radiation using a radiation system;

(c) using programmable patterning means to endow the projection beam with a desired pattern in its cross-section;

(d) projecting the patterned beam of radiation onto a target portion of the layer of radiation-sensitive material, characterized in that, prior to or during step (d):

a portion of the patterned beam is diverted aside and directed onto image detection means;

said image detection means are employed to analyze said portion of the patterned beam, and determine the extent to which the pattern contained therein corresponds to said desired pattern.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. It can also be used to write masks. The skilled artisan will appreciate that, in the context of such alternative applications, any use of the terms "wafer" or "die" in this text should be considered as being replaced by the more general terms "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

Embodiments of the invention will now be described, by way of example only, with reference to the accompanying schematic drawings in which.

In the Figures, corresponding reference symbols indicate corresponding parts.

EXAMPLE

Figure 1:
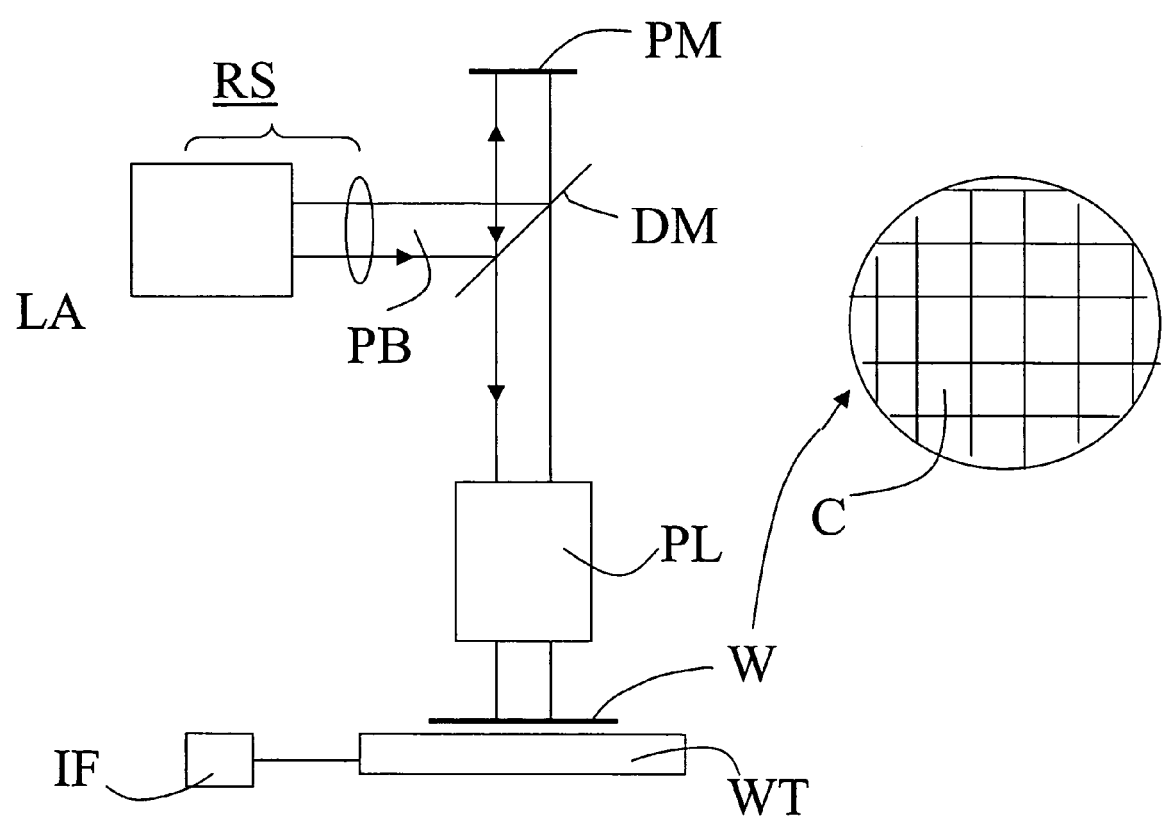
FIG. 1 depicts an imaging apparatus suitable for use with the invention.

FIG. 1 schematically depicts an imaging apparatus in conjunction with which the current invention can be employed. The apparatus comprises:
- a radiation system RS for supplying a projection beam PB of radiation (e.g. UV or EUV radiation). In this particular case, the radiation system also comprises a radiation source LA;
- patterning means PM (e.g. a programmable mirror array, or a collection of such arrays), which are connected to a pattern rasterizer (for matrix-addressing the patterning means). The beam PB is directed to the patterning means PM with the aid of deflecting means DM;
- a substrate table WT for holding a substrate W (e.g. a resist-coated silicon wafer), and connected to interferometric measurement and positioning means IF for accurately positioning the substrate with respect to item PL;
- a projection system ("lens") PL (e.g. a refractive, catadioptric or catoptric system) for imaging the beam PB onto a target portion C (e.g. comprising one or more dies) of the substrate W.

It should be noted with regard to FIG. 1 that the source LA may be within the housing of imaging apparatus, but that it may also be remote from the imaging apparatus, the radiation beam which it produces being led into the apparatus, e.g. with the aid of suitable directing mirrors. The current invention and claims encompass both of these scenarios.

Having traversed the patterning means PM, the beam PB passes through the lens PL, which focuses the beam PB onto a target portion C of the substrate W. With the aid of the interferometric measuring and positioning means IF, the substrate table. WT can be moved accurately, e.g. so as to position different target portions C in the path of the beam PB. In general, movement of the substrate table WT will be realized with the aid of a long-stroke module (coarse positioning) and a short-stroke module (fine positioning), which are not explicitly depicted in FIG. 1. The substrate W may, for example, a quartz plate onto which a mask pattern is to be written, or a silicon wafer onto which an array of device dies is to be imaged.

Embodiment 1

Figure 2:
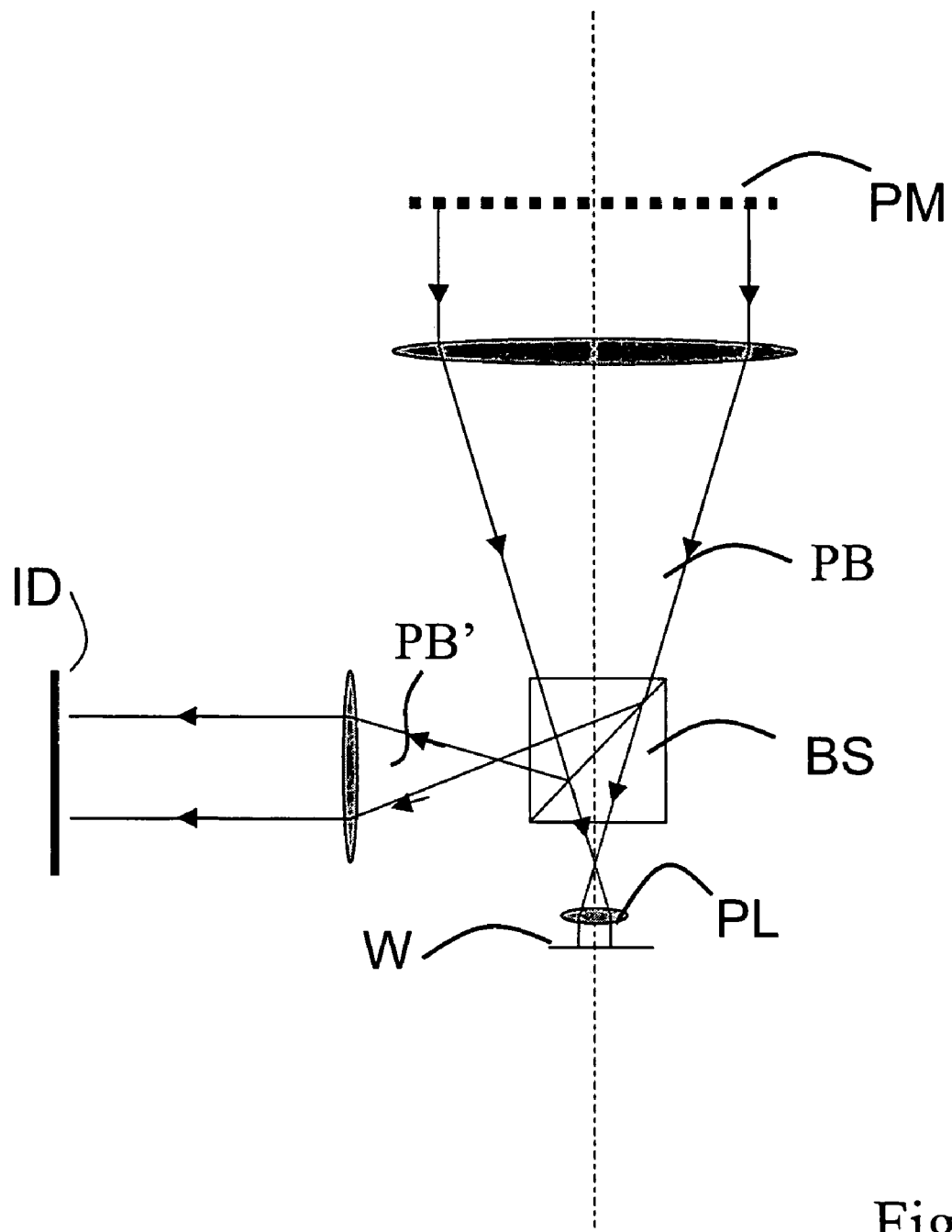
FIG. 2 depicts a first embodiment of an apparatus according to the invention.

FIG. 2 depicts part of an imaging apparatus according to a first embodiment of the invention, whereby beam splitting means BS are employed between the patterning means PM and the substrate W, serving to divert aside a portion PB' of the projection beam PB and direct it onto image detection means ID. The beam splitting means BS should not be confused with the deflection means DM in FIG. 1, which serve a different purpose. In principle, the beam splitting means BS can be located at any convenient point between items PM and W.

The image detection means (e.g. comprising a CCD array) are used to analyze the pattern in the beam PB', with the purpose of determining whether or not it corresponds to the desired pattern to be produced by the patterning means PM. If not, imaging on the substrate W can be postponed or halted, and the patterning means PM reset and "re-fired" so as to produce the intended pattern anew, which is again checked using items BS and ID. In this way, one prevents imaging occurring on the basis of a faulty pattern, caused by a pixel error in the patterning means PM or their driving electronics, for example.

As here depicted, the image detection means can, for example, be connected to a computer capable of performing image processing. Such a computer can then compare the pattern in the beam PB' with a reference pattern, and identify any discrepancies between the two.

Embodiment 2

Figure 3:
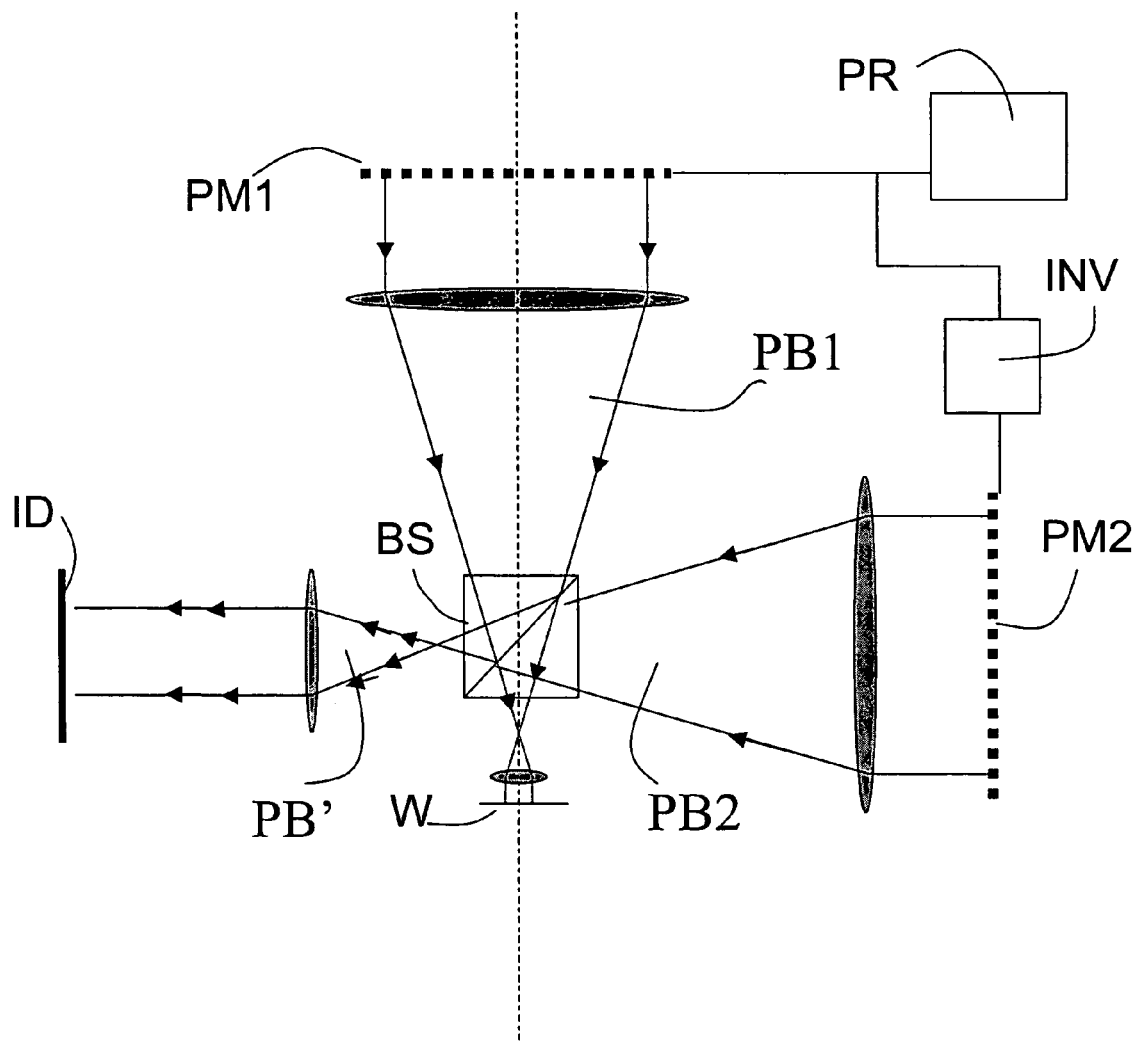
FIG. 3 shows a second embodiment of an apparatus according to the invention.

FIG. 3 shows an alternative embodiment to the situation depicted in FIG. 2. In this alternative embodiment, reference patterning means PM2 (e.g. a programmable mirror array of the same type and size as that in Embodiment 1) are connected to the same pattern rasterizer PR as main patterning means PM1 (corresponding to item PM in FIG. 2), except that the rasterizing signals to the reference patterning means PM2 are first passed through an inverter INV. Theoretically, the main patterning means PM1 and reference should then produce patterns that are identical, except in that they are each other's negative (or complement). The patterned beam PB2 produced by the reference patterning means PM2 is coupled into the beam splitting means BS, and ultimately onto the image detecting means ID.

In the absence of a pixel error, the patterned beams PB2 and PB1 should add to produce an isotropic image of uniform brightness on the detector ID. However, if there is a pixel error, this will result in a spot of higher or lower intensity on the detector ID, which in turn will produce an error signal. This is a particularly elegant method of analyzing the output from the main patterning means PM1.

As an alternative to the method discussed above, it is possible to omit the inverter between the rasterizer and the reference patterning means PM2, to project the images from PM1 and PM2 onto separate detectors, and to subtract the output signals from those detectors.

Embodiment 3

Figure 4:
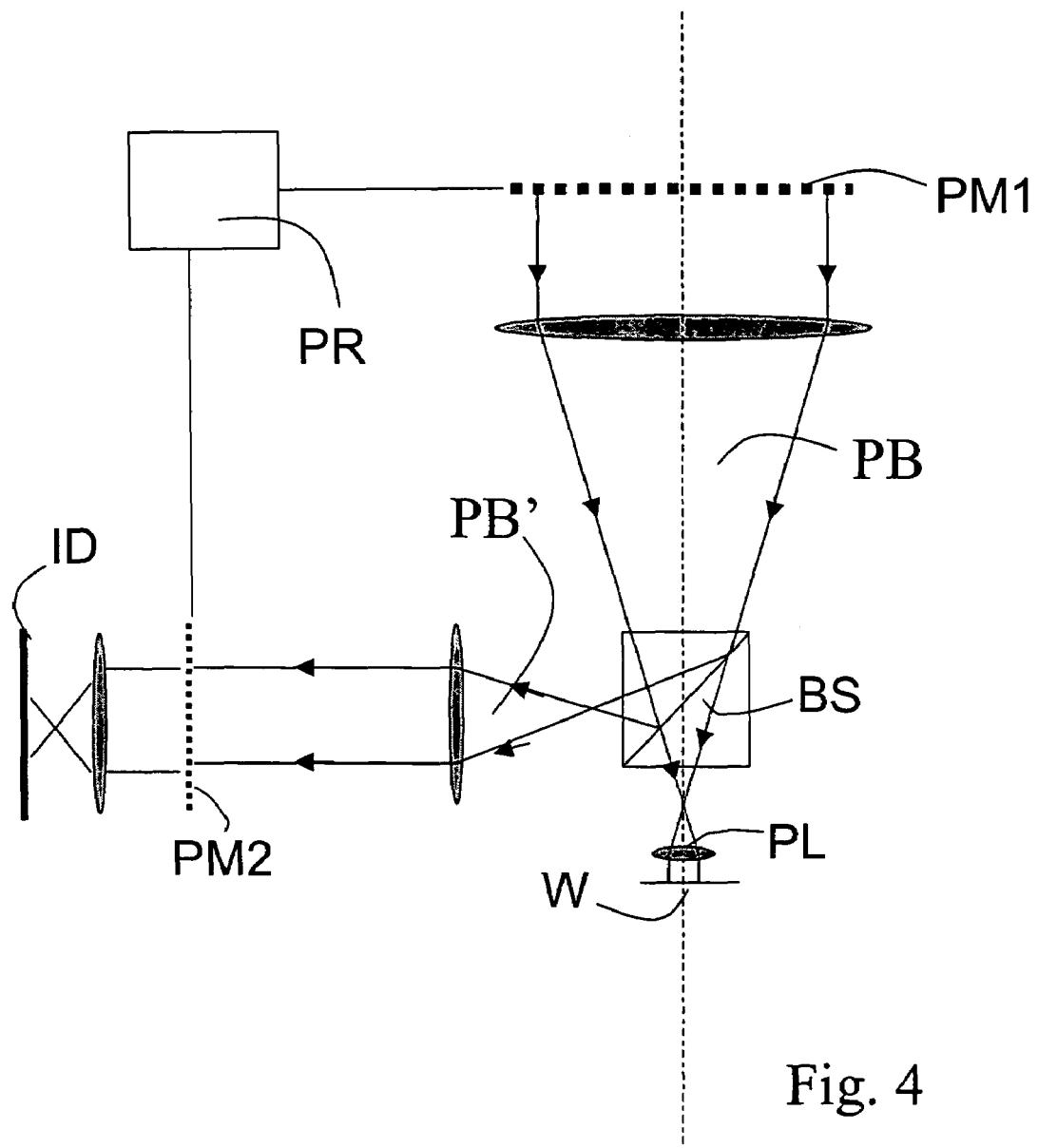
FIG. 4 illustrates a third embodiment of an apparatus according to the invention.

FIG. 4 shows a variant of the embodiment depicted in FIG. 3. In FIG. 4, the reference patterning means PM2 are situated between the beam splitting means BS and the detector ID. As here depicted, the reference patterning means PM2 are transmissive; however they may also be reflective, without disturbing the principle of operation depicted in FIG. 4.

Whilst specific embodiments of the invention have been described above, it will be appreciated that the invention may be practiced otherwise than as described. The description is not intended to limit the invention.

The invention claimed is:

1. An imaging apparatus comprising:
   an illuminator configured to condition a beam of radiation having a wavelength equal to or shorter than 365 nm;
   a support structure to support a programmable patterning device, the programmable patterning device configured to pattern the beam according to a desired pattern;
   a substrate table configured to hold a substrate;
   a projection system configured to project the patterned beam onto a target portion of the substrate;
   a beam splitter, located between the programmable patterning device and the substrate table, configured to divert aside a portion of the patterned beam; and
   an image detector configured to analyze said portion of the patterned beam.

2. An imaging apparatus according to claim 1, wherein the image detector is configured to compare an actual image produced by the programmable patterning device with a reference image produced by a reference patterning device.

3. An imaging apparatus according to claim 2, wherein said reference image is a negative of said actual image, and the image detector is configured to add or substract said actual and reference images.

4. An imaging apparatus according to claim 3, wherein said reference image is a desired image, and the image detector is configured to subtract said actual and reference images.

5. An imaging apparatus according to any of the claims 1-3, wherein the image detector includes a detection device selected from the group comprising charge-coupled devices, CMOS detectors, photodiodes and photomultiplier tubes.

6. An imaging apparatus according to claim 1, wherein the image detector is configured analyze an actual image produced by the programmable patterning device to determine whether it corresponds to a desired pattern to be produced by the programmable patterning device.

7. An imaging apparatus according to claim 6, configured to halt or postpone imaging of the substrate if the actual image does not correspond to the desired pattern.

8. An imaging apparatus according to claim 6, configured to reset the programmable patterning device if the actual image does not correspond to the desired pattern.

9. An imaging apparatus according to claim 1, wherein said portion of the patterned beam is arranged to be diverted to traverse a reference patterning device before reaching the image detector.

10. A method for manufacturing a device, the method comprising:
    providing a substrate that is at least partially covered by a layer of radiation-sensitive material;
    providing a projection beam of radiation having a wavelength equal to or shorter than 365 nm using a radiation system;
    using a programmable patterning device to condition the projection beam with a desired pattern in its cross-section; and
    projecting the patterned beam of radiation onto a target portion of the layer of radiation-sensitive material, wherein prior to or during the projecting, a portion of the patterned beam is diverted aside and directed onto an image detector, said image detector configured to analyze said portion of the patterned beam, and determine the extent to which the pattern contained therein corresponds to said desired pattern.

11. A device manufacturing method according to claim 10, comprising comparing an actual image produced by the programmable patterning device with a reference image produced by a reference patterning device.

12. A device manufacturing method according to claim 11, wherein said reference image is a negative of said actual image, and comprising adding or subtracting said actual and reference images.

13. A device manufacturing method according to claim 11, wherein said reference image is a desired image, and the image detector is configured to subtract said actual and reference images.

14. A device manufacturing method according to claim 10, wherein the image detector includes a detection device selected from the group comprising charge-coupled devices, CMOS detectors, photodiodes and photomultiplier tubes.

15. A device manufacturing method according to claim 10, comprising analyzing an actual image produced by the programmable patterning device to determine whether it corresponds to a desired pattern to be produced by the programmable patterning device.

16. A device manufacturing method according to claim 15, comprising halting or postponing imaging of the substrate if the actual image does not correspond to the desired pattern.

17. A device manufacturing method according to claim 15, comprising resetting the programmable patterning device if the actual image does not correspond to the desired pattern.

18. A device manufacturing method according to claim 10, wherein said portion of the patterned beam traverses a reference patterning device before reaching the image detector.

* * * * *